(12) United States Patent
Mori et al.

(10) Patent No.: US 7,678,641 B2
(45) Date of Patent: Mar. 16, 2010

(54) SEMICONDUCTOR DEVICE AND FABRICATION PROCESS THEREOF

(75) Inventors: Toshifumi Mori, Kawasaki (JP);
Katsuaki Ookoshi, Kawasaki (JP);
Takashi Watanabe, Kawasaki (JP);
Hiroyuki Ohta, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 11/211,103

(22) Filed: Aug. 25, 2005

(65) Prior Publication Data

US 2006/0278952 A1 Dec. 14, 2006

(30) Foreign Application Priority Data

Jun. 14, 2005 (JP) ............... 2005-173695

(51) Int. Cl.
*H01L 29/00* (2006.01)
(52) U.S. Cl. ............... 438/221; 438/200; 257/E21.546; 257/E29.021
(58) Field of Classification Search ............ 257/510, 257/E29.021, E21.43, E29.546; 438/221, 438/200
See application file for complete search history.

(56) References Cited

U.S. PATENT DOCUMENTS

| | | | |
|---|---|---|---|
| 6,518,148 B1 * | 2/2003 | Cheng et al. ............... 438/437 |
| 6,531,377 B2 | 3/2003 | Knorr et al. |
| 6,979,627 B2 | 12/2005 | Yeap et al. |
| 2002/0063292 A1 | 5/2002 | Armstrong et al. |
| 2004/0132257 A1 | 7/2004 | Furuhashi et al. |
| 2004/0191977 A1 * | 9/2004 | Li et al. ............... 438/200 |
| 2004/0259315 A1 * | 12/2004 | Sakaguchi et al. ......... 438/285 |
| 2005/0032321 A1 * | 2/2005 | Huang et al. ............... 438/301 |
| 2005/0242403 A1 * | 11/2005 | Yeap et al. ............... 257/374 |
| 2006/0024872 A1 * | 2/2006 | Goodlin et al. ............ 438/196 |
| 2006/0160322 A1 * | 7/2006 | Buehrer et al. ............ 438/424 |

FOREIGN PATENT DOCUMENTS

CN  1947260 A  4/2007
JP  6-97274  4/1994

OTHER PUBLICATIONS

Chinese Office Action dated Mar. 7, 2008, issued in corresponding Chinese patent application No. 200510103956.5.

* cited by examiner

*Primary Examiner*—Thomas L Dickey
*Assistant Examiner*—Fazli Erdem
(74) *Attorney, Agent, or Firm*—Westerman, Hattori, Daniels & Adrian, LLP

(57) ABSTRACT

There is provided a semiconductor device having a device isolation region of STI structure formed on a silicon substrate so as to define a device region, wherein the device isolation region comprises a device isolation trench formed in the silicon substrate, and a device isolation insulation film filling the device isolation trench. At least a surface part of the device isolation insulation film is formed of an HF-resistant film.

11 Claims, 18 Drawing Sheets

SEMICONDUCTOR DEVICE AND FABRICATION PROCESS THEREOF

CROSS-REFERENCE TO RELATED APPLICATION

The present application is based on Japanese priority application No. 2005-173695 filed on Jun. 14, 2005, the entire contents of which are hereby incorporated by reference.

BACKGROUND OF THE INVENTION

The present invention generally relates to semiconductor devices, and more particularly to a semiconductor device having a STI structure and fabrication process thereof.

With progress in the art of device miniaturization, it is now possible to fabricate ultrafine/ultra high-speed semiconductor devices having a gate length of less than 100 nm. In such ultrafine/ultra high-speed semiconductor devices, an STI (shallow trench isolation) structure is used commonly as a device isolation structure.

With such ultrafine/ultrahigh speed transistors, it should be noted that the area of the channel region right underneath the gate electrode is far smaller as compared with the case of conventional semiconductor devices, and thus, mobility of electrons or holes traveling through the channel region is influenced heavily by the stress applied to the channel region. Thus, various attempts have been made so far for improving the operational speed of the semiconductor device by optimizing the stress applied to the channel region thereof.

REFERENCE

Patent Reference 1 Japanese Laid-Open Patent Application 6-97274 official gazette

SUMMARY OF THE INVENTION

In the case of forming a semiconductor integrated circuit device on a silicon substrate, it is generally practiced to form an STI structure at first, and semiconductor devices constituting the semiconductor integrated circuit device are formed in the device regions defined by such an STI structure.

Generally, a semiconductor integrated circuit device includes therein transistors of different operational voltages and thus having gate insulation films of different film thicknesses, and thus, it is commonly practiced in the art to form a high-voltage transistor having the gate oxide film of largest film thickness at first. Thereby, ultrafine/ultrahigh speed transistors having the gate insulation film of minimum film thickness is formed in the latter stage of fabrication process of the semiconductor integrated circuit device.

With such fabrication process of semiconductor integrated circuit devices, therefore, there are repeatedly conducted the steps of removing a thick gate insulation film formed for higher voltage transistors by an HF treatment from the device regions for lower voltage devices and subsequently forming a new gate insulation film with smaller film thickness. Thereby, the surface of the device isolation insulation film forming the STI structure is applied with repeated etching process by an HF etchant by the time the process of forming the ultrafine/ultrahigh speed transistors is to be commenced. Thereby, there may appear a structure schematically shown in FIG. 1A, in which it can be seen that there has been caused subsiding in the STI structure as a result of the repeated etching.

Referring to FIG. 1A, it should be noted the STI structure is formed by forming a device isolation trench in a silicon substrate 1 and subsequently filling the trench by a CVD oxide film 2, with an interposed step of applying a thermal oxidation processing to the surfaces of the device isolation trench thus formed. Thereby, the STI structure defines a device region 1A on the silicon substrate 1, and a semiconductor device including therein a gate insulation film, a gate electrode, and source and drain regions, is formed on the device region 1A thus defined.

Meanwhile, with modern ultrahigh speed MOS transistors characterized by short gate length, there is a need of forming the gate insulation film by using a high quality insulation film free from electric charges, traps, or the like. In order to form the gate insulation film with high quality, there is a need of conducting a thermal annealing process in a hydrogen ambient prior to formation of the gate insulation for removing native oxide film from the surface of the device region on which the gate insulation film is to be formed, while it should be noted that such heat treatment process in hydrogen ambient, conducted for removing of native oxide film from the surface of the device region, also causes elimination of pinning effect of the Si atoms on the surface of the device region caused by the oxide film, and it becomes possible for the Si atoms to move freely over the surface of the device region after removal of the native oxide film.

Thus, when there has been caused subsiding in the STI structure 2 that defines the device region 1A, there arises a problem in that the shoulder part of the device region 1A experiences rounding as shown in FIG. 1B, and the surface of the device region is reorganized to form a curved, convex surface. When a MOS transistor is formed on such a curved convex device region 1A, the gate width is deviated from designed value, and there arise problems such as variation of device characteristics such as variation of ON current $I_{ON}$. Further, because such a curved surface is a surface different from (100) surface of Si, there can be a problem in the film quality of the gate insulation film thus formed on a non-(100) surface. Further, associated with the subsiding of the STI structure, there may be caused a leakage current to flow along the device isolation trench.

Further, with recent ultrafine/ultrahigh speed MOS transistor, in particular, attempt is being made to improve the operational speed thereof by applying a stress to the channel region as noted before, while appearance of such curved surface of device region raises a serious problem particularly in the case of a high speed p-channel MOS transistor having a stressed channel as explained below.

FIG. 2 shows an example of the high speed p-channel MOS transistor having such a stressed channel according to a related art of the present invention, while FIG. 3 shows the principle of the MOS transistor of FIG. 2.

Referring to FIG. 2, a p-channel MOS transistor is formed in a device region 11A defined on a silicon substrate 11$b$P by an STI region 11I and includes a polysilicon gate electrode 13P formed via a gate insulation film 12. Further, a source extension region 11$a$P and a drain extension region 11$b$P of p-type are formed in the silicon substrate 11 at respective lateral sides of the polysilicon gate electrode 13P.

Further, the sidewall surfaces of the polysilicon gate electrode 13P are covered by sidewall oxide films 13Ox of a CVD oxide film, wherein it will be noted that the sidewall oxide films 13Ox cover the surface part of the silicon substrate 11 where the source extension region 11$a$P and the drain extension region 11$b$P are formed.

Further, sidewall insulation films 13WN of SiN are formed on the respective sidewall oxide films 13Ox, while in the silicon substrate 11, there are formed a source region 11SP and a drain region 11SD of p-type at respective outer sides of the sidewall insulation films 13WN. Further, a source buffer region 11SPb and a drain buffer region 11DPb of p-type are formed so as to include the source region 11SP and the drain region 11SD.

In the p-channel MOS transistor of FIG. 2, it should be noted that there are formed trenches in the source region 11S and in the drain region 11D respectively, wherein a p-type SiGe epitaxial layer 14A is formed so as to fill the trench of the source region 11S. Similarly, an epitaxial layer 14B of p-type SiGe fills the trench formed in the drain region 11D. Further, in the construction of FIG. 2, a p-type SiGe polycrystal region 14C is formed on the polysilicon gate electrode 13P.

Next, the principle of the p-channel MOS transistor of FIG. 2 will be explained with reference to FIG. 3 showing the construction of FIG. 2 with simplification.

Referring to FIG. 3, there is formed a gate electrode 3 via a gate insulation film 12 corresponding to the channel region on the silicon substrate 11, and p-type diffusion regions 11$a$P and 11$b$P are formed in the silicon substrate 11 at respective lateral sides of the gate electrode 3 so as to define a channel region therebetween. Further, on the sidewall surfaces of the gate electrode 3, there are formed sidewall insulation films 13WN of SiN via sidewall oxide films 13Ox of a CVD oxide film formed so as to also cover a part of the surface of the silicon substrate 1 continuously.

The diffusion regions 11$a$P and 11$b$P function as source and drain extension regions of the MOS transistor, and thus, the holes are transported through the channel region right underneath the gate electrode 3 from the diffusion region 11$a$P to the diffusion region 11$b$P, wherein the flow of the holes is controlled by a gate voltage applied to the gate electrode 3.

In the construction of FIG. 3, the SiGe mixed crystal layers 11A and 11B are formed epitaxially to the silicon substrate 11 at further outer sides of the sidewall insulation film 13WN in the silicon substrate 11, and source and drain regions 11S and 11D (not shown in FIG. 3) of p-type are formed in the SiGe mixed crystal layers 11A and 11B in continuation to the diffusion regions 11$a$P and 11$b$P, respectively.

In the MOS transistor of the construction of FIG. 3, the SiGe mixed crystal layers 11A and 11B have a larger lattice constant-than the silicon substrate 11, and because of this, there is induced a compressive stress shown by arrows a in the SiGe mixed crystal layers 11A and 11B, and as a result, the SiGe mixed crystal layers 11A and 11B are deformed generally in a vertical direction to the surface of the silicon substrate 11 as shown in FIG. 3 by an arrow b.

Because the SiGe mixed crystal layers 11A and 11B are formed epitaxially to the silicon substrate 11, such straining in the SiGe mixed crystal layers 11A and 11B represented by the arrow b induces a corresponding elongating strain in the channel region of the silicon substrate as represented by an arrow c, while such a strain c induces a uniaxial compressive stress in the channel region as shown by arrows d.

In the MOS transistor of FIG. 3, it should be noted that the symmetry of the Si crystal constituting the channel region is modified locally as a result of such uniaxial compressive stress applied to the channel region, while such change of symmetry causes cancellation of degeneration state of light holes and heavy holes in the valence band. With this, there is induced an increase of hole mobility in the channel region and hence improvement of operational speed of the transistor. It should be noted that such increase of hole mobility and associated improvement of operational speed by the locally induced stress in the channel region appears especially conspicuously with ultrafine semiconductor devices having a gate length of 100 nm or less.

In order to increase the stress applied to the channel with such a stressed MOS transistor, it is necessary that the SiGe mixed crystal layers 11A and 11B have a substantial volume. Thus, in the example of FIG. 2, the SiGe mixed crystal layers 11A and 11B are caused to grow beyond the surface of the silicon substrate 11, more precisely beyond the interface between the silicon substrate 11 and the gate insulation film 12. In relation to this, the sidewall surface of the SiGe mixed crystal layers 14A and 14B are formed to define an oblique facet with respect to the substrate surface, especially a (111) crystal surface.

Thus, when there is caused subsiding of STI structure explained previously with such a stressed MOS transistor, the state of the device changes from an ideal state shown in FIG. 4A to a state of FIG. 4B, and there occurs a decrease of effective volume for the SiGe mixed crystal layer 14A, which functions as a compressive stress source, by the amount shown in FIG. 4B with a broken line. Here, it should be noted that FIGS. 4A and 4B show a part of the p-channel MOS transistor of FIG. 2.

Here, it should be noted that the effect of formation of curvature in the surface of the device region caused with heat treatment in hydrogen ambient explained with reference to FIG. 1B is not shown in FIG. 4B. Thus, the foregoing problem of volume decrease of the compressive stress source with formation of the facets would become worse when the effect of the curved surface of the device region is taken into consideration. This effect of facet appears more conspicuously in small MOS transistors in which the device region has a small area as compared with large MOS transistors having a large area for the device region, as shown in FIG. 5.

In a first aspect, the present invention provides a semiconductor device having a device isolation region of STI structure formed on a silicon substrate so as to define a device region, said device isolation region comprising:

a device isolation trench formed in said silicon substrate; and a device isolation insulation film filling said device isolation trench, at least a surface part of said device isolation insulation film being formed of an HF-resistant film.

In another aspect, the present invention provides a fabrication process of a semiconductor device, comprising the steps of:

forming a device isolation trench in a silicon substrate while using an SiN pattern as a mask; and depositing an HF resistant film so as to fill at least an upper part of said device isolation trench and so as to cover said SiN pattern; and removing said SiN pattern and said HF-resistant on said SiN pattern, said HF-resistant film being formed by a low-pressure CVD process while using bis-tertiary butylaminosilane as a source material.

According to the present invention, subsiding of the STI structure is prevented even when the silicon substrate is subjected to HF treatment repeatedly, by forming such an HF-resistant film in the device isolation region of STI structure such that the HF-resistant film is formed at least in the surface part of the device isolation insulation film. Thereby, the problem such as occurrence of leakage current associated with subsiding of the STI structure is successfully avoided. Further, with such a construction, the Si atoms at the peripheral part of the device region are held by the insulation film forming the STI structure. Thus, formation of curved surface in the device region is successfully suppressed even when thermal processing in hydrogen ambient is conducted prior to formation of the gate insulation film. Thereby, it becomes possible to maintain the gate width of the semiconductor device to a designed value, and it becomes further possible to form a gate insulation film with high quality. Especially, in the case such a construction is applied to a p-channel MOS transistor that includes a p-type SiGe mixed crystal region as a compressive stress source in the source and drain regions, it becomes possible to decrease the area of the facets that define the SiGe mixed crystal region as compared with the case in which the STI structure has caused subsiding. Thereby, it becomes possible to secure sufficient volume for the SiGe mixed crystal regions, and a large compressive stress can be induced in the channel region.

Further, according to the present invention, it becomes possible to realize a very large resistance to HF in the HF-resistant film by forming an SiOCN film or SiCN film as the HF-resistant film by a low-pressure CVD process while using bis-tertiary butylaminosilane as the source material. By forming such an HF-resistant film in at least the upper part of STI structure, it becomes possible to suppress the subsiding of the STI structure even in the case the HF treatment is repeatedly applied to the silicon substrate.

Other objects and further features of the present invention will become apparent from the following detailed description when read in conjunction with the attached drawings.

DETAILED DESCRIPTION OF THE INVENTION

First Embodiment

FIGS. 6A-6G show the fabrication process of a semiconductor device according to a first embodiment of the present invention.

Figure 6A:
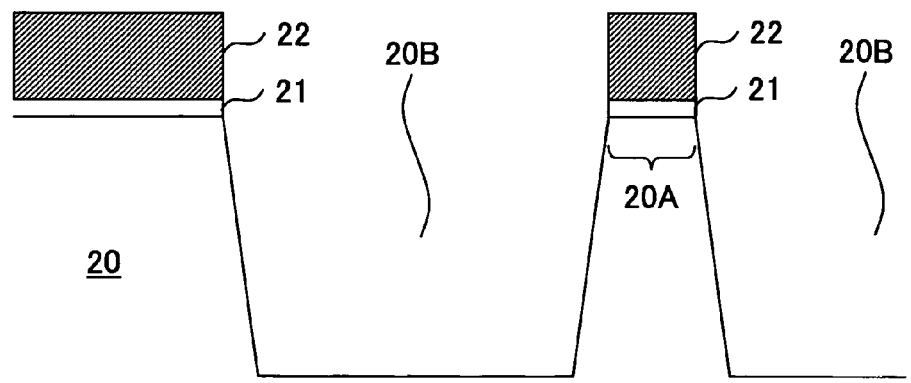
FIGS. 6A-6G are diagrams showing the fabrication process of a semiconductor device according to a first embodiment of the present invention.

Referring to FIG. 6A, there is formed an SiN film on a silicon substrate 20 via a sacrifice oxide film 21 having a thickness of about 10 nm by a pyrolitic CVD process conducted at a substrate temperature of 775° C. with a thickness of 105 nm. Further, the SiN film is patterned to form an SiN pattern, and a device isolation trench 20B is formed in the silicon substrate 20 while using the SiN pattern 22 thus patterned as a mask, such that the device isolation trench 20B defines a device region 20A.

Figure 6B:
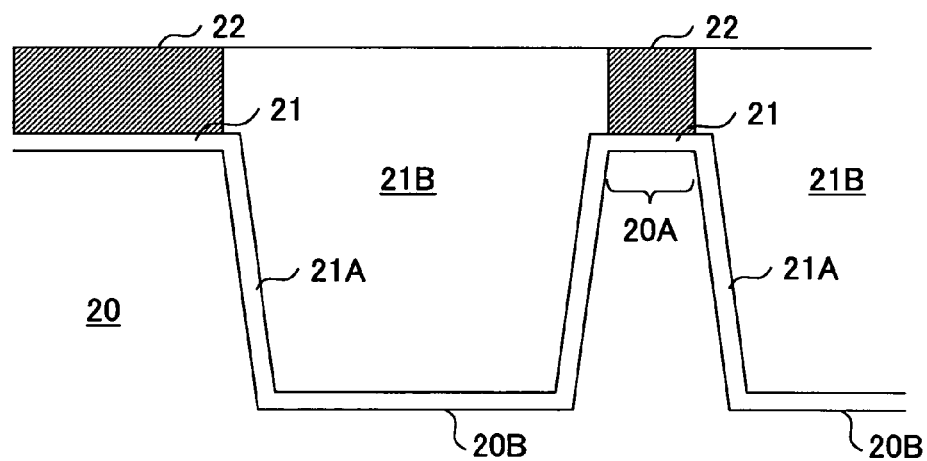

Further, in the step of FIG. 6B, a thermal oxide film 21A is formed on the sidewall surfaces and bottom surface of the device isolation trench 20B, and the device isolation trench 20B is filled thereafter with a CVD oxide film 21B.

More specifically, the thermal oxide film 21A is formed on the sidewall surfaces and bottom surface of the device isolation trench 20B with a thickness of about 3 nm, and the CVD oxide film 21B is deposited on the structure of FIG. 6A by a high density plasma CVD process so as to fill the device isolation trench 20B. Further, by removing a part of the CVD oxide film 21B located on the SiN pattern 22 by a CMP process, a structure is obtained such that the surface level of the CVD oxide film 21B coincides with the surface level of the SiN film 22.

Figure 6C:
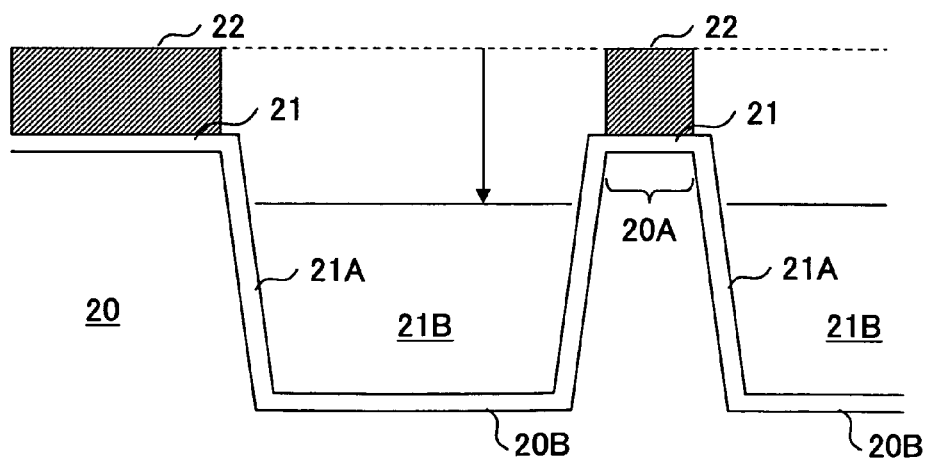
Figure 6D:
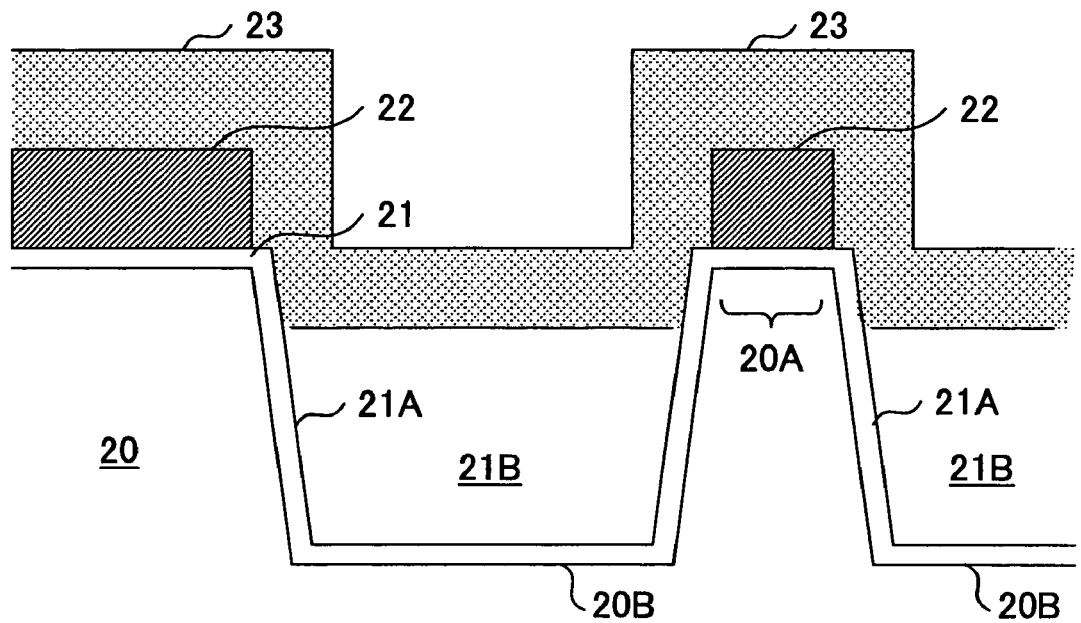

Next, in the step of FIG. 6C, the CVD oxide film 21B is partially removed by a wet etching process conducted by an HF etchant with a depth of 80-120 nm, for example, and an SiOCN film or an SiCN film 23 is formed in the step of FIG. 6D as an HF-resistant film so as to cover the structure of FIG. 6C. More specifically, the HF-resistant film 23 is formed by a low-pressure CVD process while using bis-tertiary butylaminosilane (BTBAS) as the source material with a thickness such that the surface level of the HF-resistant film 23 is generally coincident to the surface level of the silicon substrate on the trench 20B.

It should be noted that bis-tertiary butylaminosilane has a chemical formula represented as

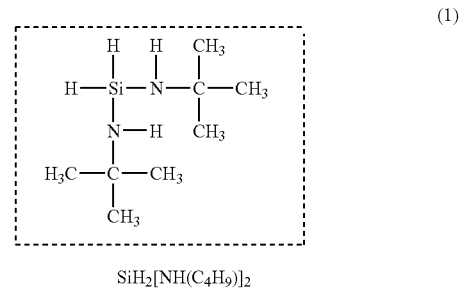

and causes a reaction with oxygen or N$_2$O in the low-pressure CVD process as:

and with this, an SiOCN film is obtained as a result of the reaction. It should be noted that the SiOCN film thus formed contains C with a concentration level exceeding dopant concentration level. For example, it is confirmed as a result of chemical analysis of the SiOCN film thus obtained that the ratio of Si, O, N and C in the film is 2:2:2:1.

Further, by using ammonia instead of oxygen or $N_2O$ in the foregoing reaction, it is possible to obtain an SiCN film having a chemical formula represented as

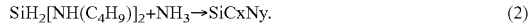
$$SiH_2[NH(C_4H_9)]_2 + NH_3 \rightarrow SiCxNy. \quad (2)$$

Figure 7:
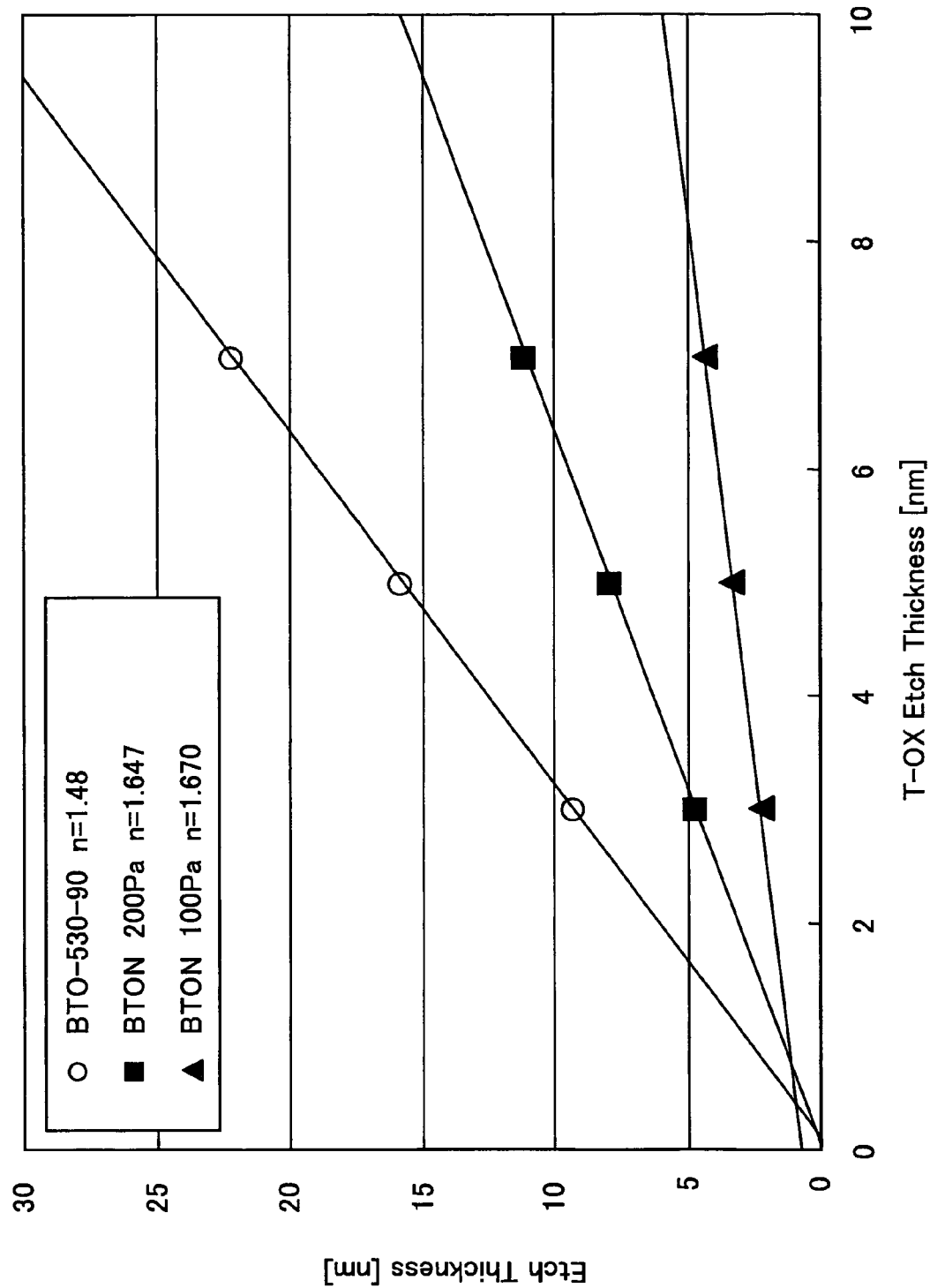
FIG. 7 is a diagram showing the HF-resistance of an SiOCN film used with the first embodiment of the present invention.

FIG. 7 is a diagram showing the HF etching resistance of the SiOCN film thus obtained in comparison with a thermal oxide film. In the drawing the vertical axis represents the etching rate of the SiOCN film while the horizontal axis represents the etching rate of the thermal oxide film.

Referring to FIG. 7, the sample represented with ○ corresponds to the SiOCN film formed under the process pressure 20 Pa at the substrate temperature of 530° C., while the sample represented with ■ corresponds to the SiOCN film formed under the pressure of 200 Pa at the substrate temperature of 530° C. It can be seen that the SiOCN film formed under the foregoing conditions has a much larger etching rate as compared with a thermal oxide film and is thought not suitable for the HF-resistant film 23.

Contrary to this, the specimen shown in FIG. 7 with ▲ A corresponds to an SiOCN film formed under a lower process pressure of 100 Pa at the substrate temperature of 530° C., wherein it can be seen that this specimen has a large refractive index of 1.670 and shows an etching rate of about 60% of the etching rate of the thermal oxide film. This means that the SiOCN film represented in FIG. 7 with ▲ can be used successfully for the etching resistant film 23.

Referring to FIG. 6D again, the present embodiment thus uses an SiOCN film formed by conducting the reaction (2) under the processing pressure of the 100 Pa or less, for the HF-resistant film 23, and covers the upper part of the CVD oxide film 21B in the device isolation trench by the SiOCN film 23 thus formed. Alternatively, the SiCN film formed by the reaction (3) may be used for the HF-resistant film 23.

Figure 6E:
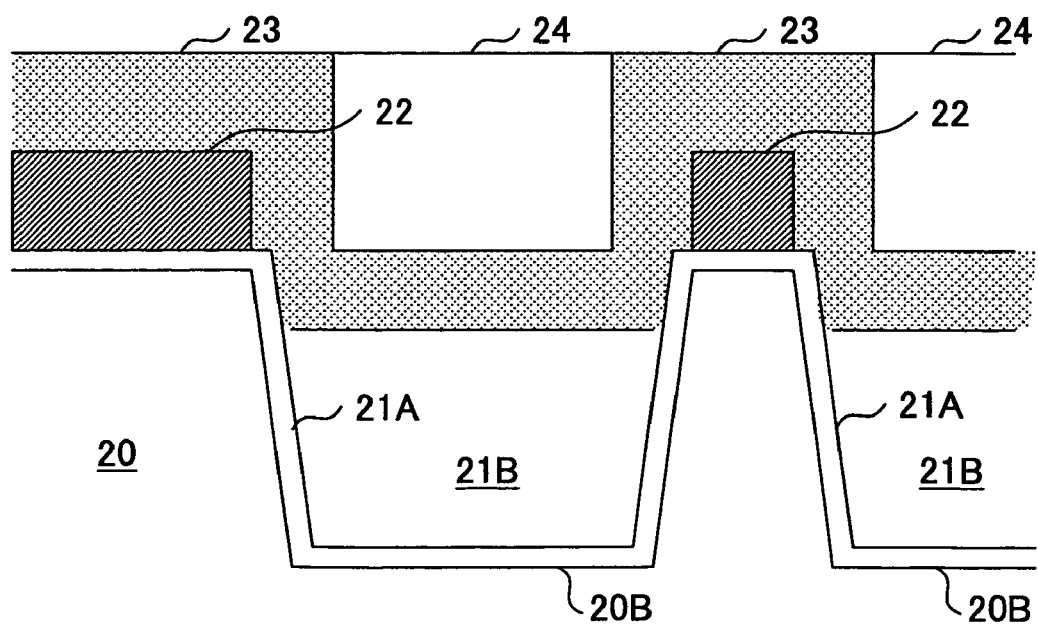

Further, after the step FIG. 6D, a CVD silicon oxide film is deposited on the structure of FIG. 6D by a high density plasma CVD process, and a silicon oxide pattern 24 is formed on the HF-resistant film 23 in correspondence to the device isolation trench 20B as shown in FIG. 6E, by polishing away the CVD silicon oxide film thus deposited by a CMP process, until the HF-resistant film 23 is exposed.

Figure 6F:
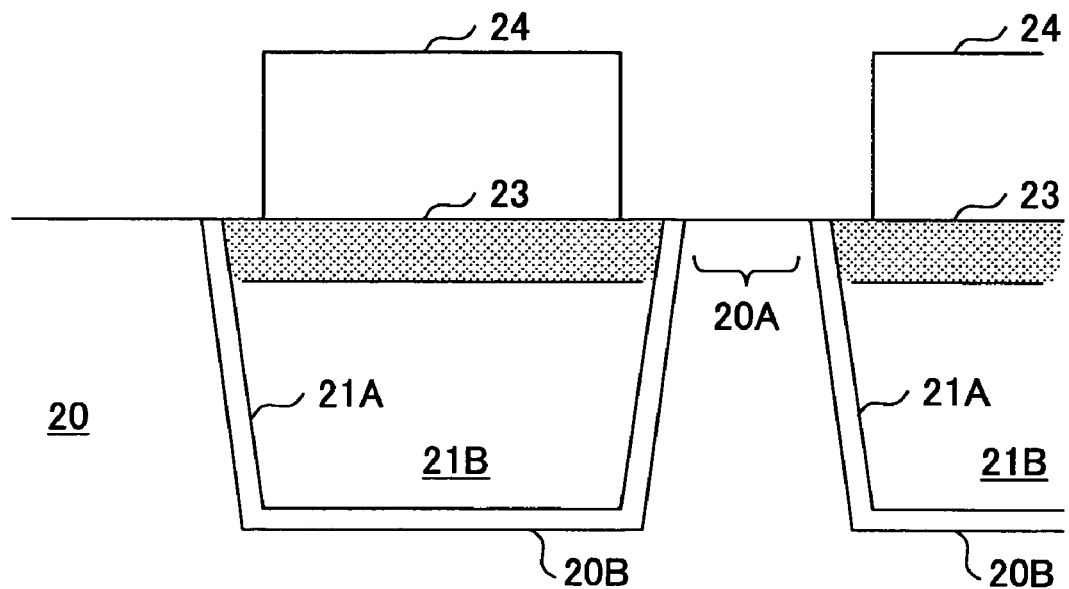

Next, in the step of FIG. 6F, the HF-resistant film 23 and the SiN pattern 22 are removed by a pyrophosphoric acid processing while using the silicon oxide film pattern 24 as a mask. Further, by removing the silicon oxide pattern 24 by a wet etching processing of HF, a device isolation structure free from subsiding of STI structure is obtained as shown in FIG. 6G.

It should be noted that the SiOCN film or the SiCN film used for the HF-resistant film 23 is soluble to pyrophosphoric acid with an etching rate equal to or slightly smaller than an etching rate of SiN. Thus there occurs no such a situation in the pyrophosphoric acid processing of FIG. 6F that the HF-resistant film 23 is removed in the device isolation trench 20B at the time of removal of the SiN pattern 22 and the silicon oxide film 21B filing the device isolation trench 20B is exposed.

Figure 6G:
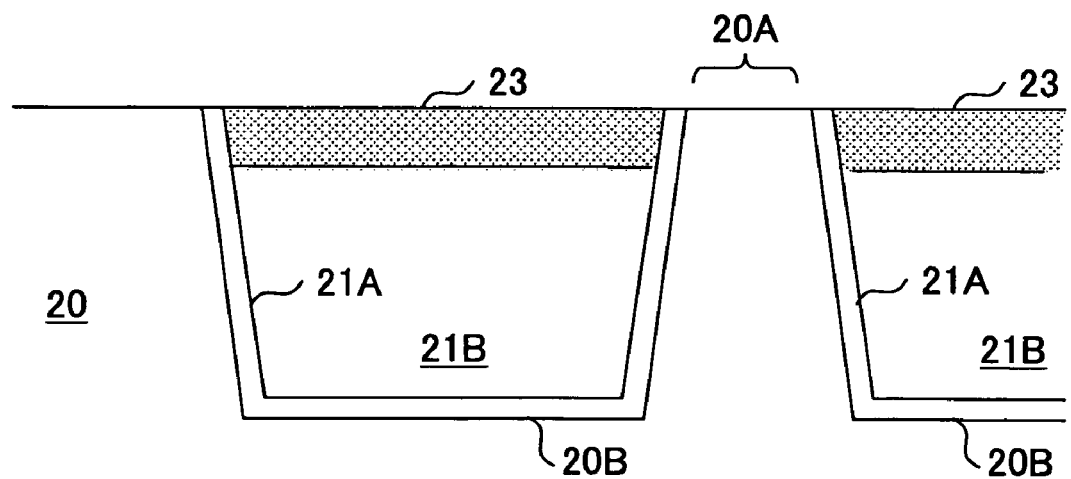
Figure 8A:
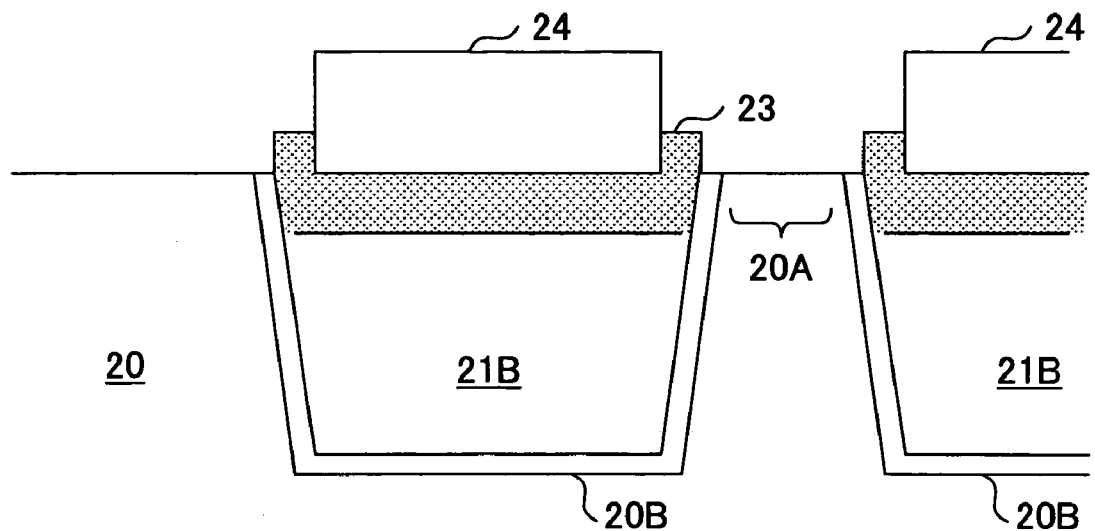
FIGS. 8A and 8B are diagrams showing a first modification of the present embodiment.
Figure 8B:
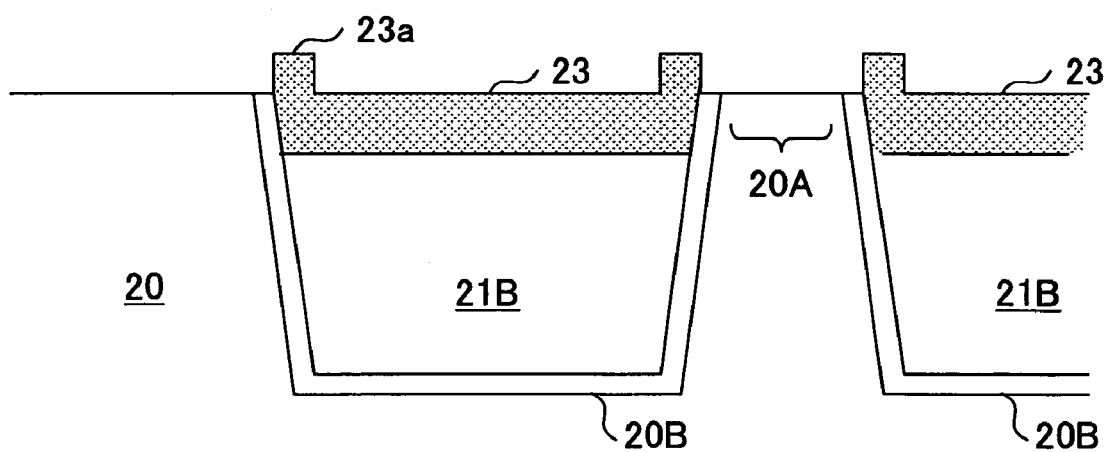

In the case the SiOCN or SiCN film has a substantially smaller etching rate as compared with SiN at the time of the pyrophosphoric acid processing pyrophosphoric acid processing, there appear a situation in which a part of the HF-resistant film 23 protrudes after the pyrophosphoric acid processing as shown in FIGS. 8A and 8B, wherein it should be noted that FIGS. 8A and 8B correspond to FIGS. 6F and 6G, respectively. In such a case, there is formed a minor protrusion 23a.

Figure 9:
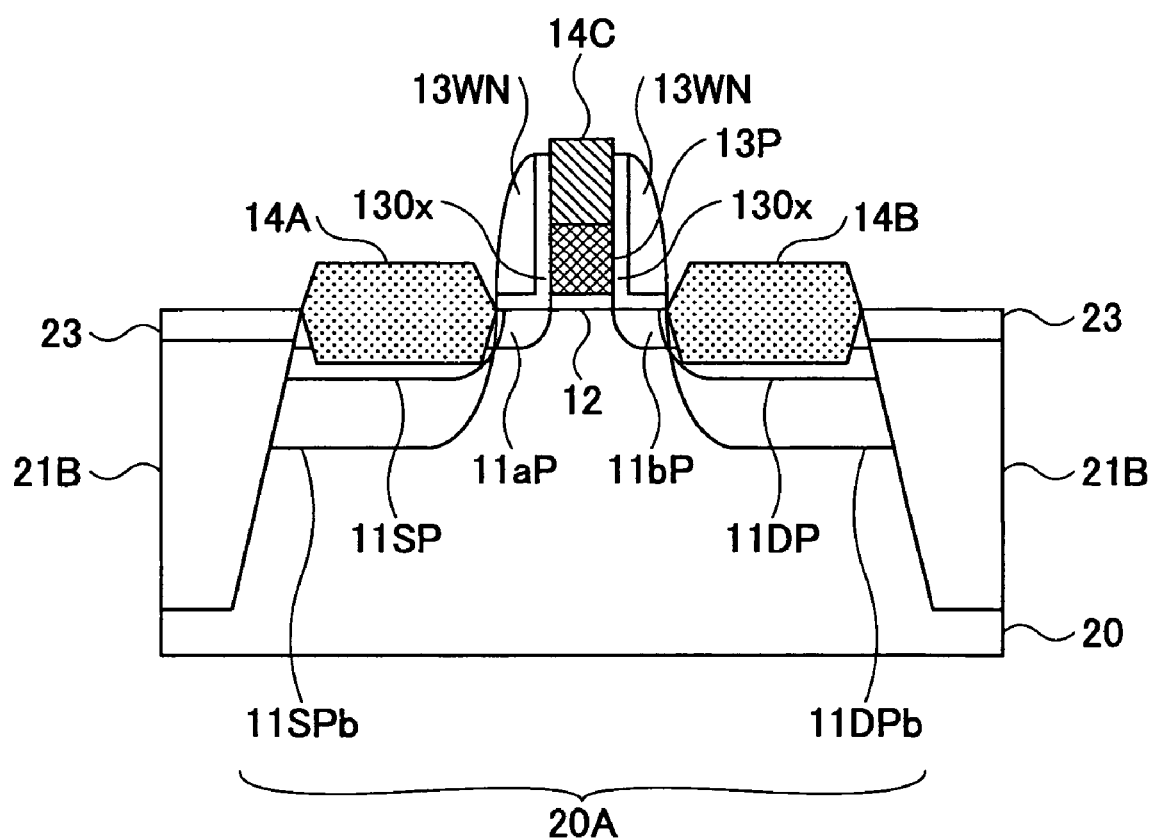
FIG. 9 is a diagram showing the construction of a semiconductor device according to a first embodiment of the present invention.

FIG. 9 shows the case in which a p-channel MOS transistor having the SiGe compressive stress sources 14A and 14B is formed in the device region 20A defined on the silicon substrate 20 by the device isolation region 20 having such an HF-resistant film 23 in the upper part of the device isolation insulation film. In the drawing, those parts explained previously are designated by the same reference numerals and the description thereof will be omitted.

Figure 1A:
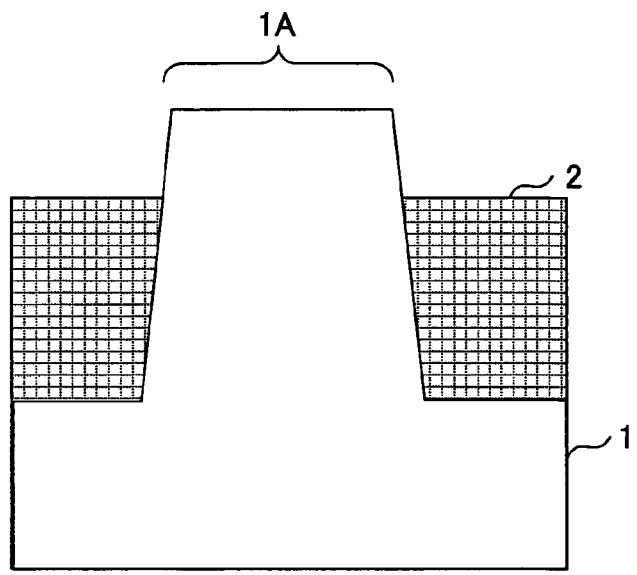
FIGS. 1A and 1B are diagrams explaining the problem of subsiding of STI structure and associated problem of curving of device region surface according to a related art of the present invention.
Figure 1B:
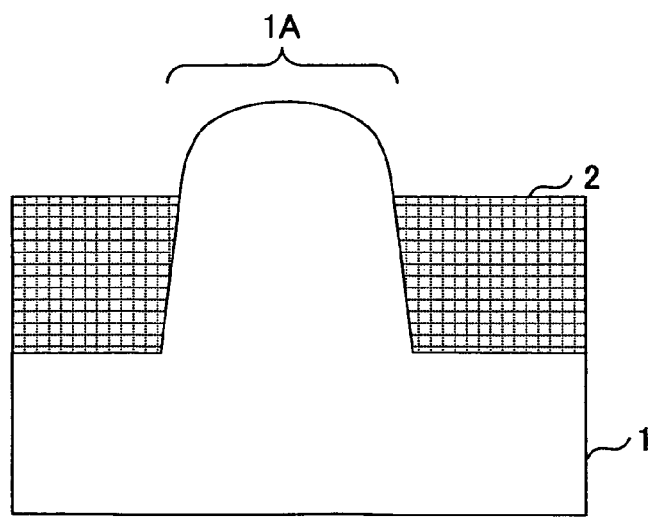
Figure 2:
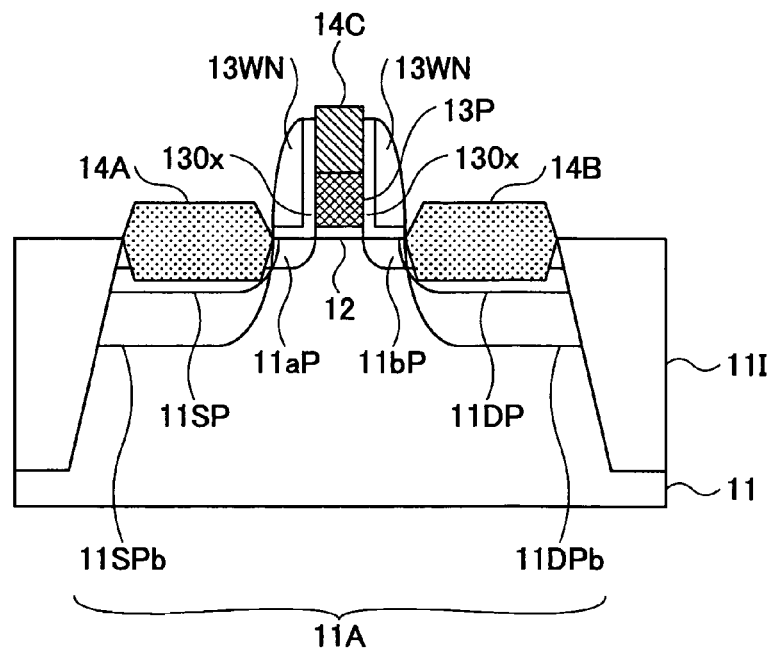
FIG. 2 is a diagram showing the construction of a p-channel MOS transistor according to a related art of the present invention.
Figure 3:
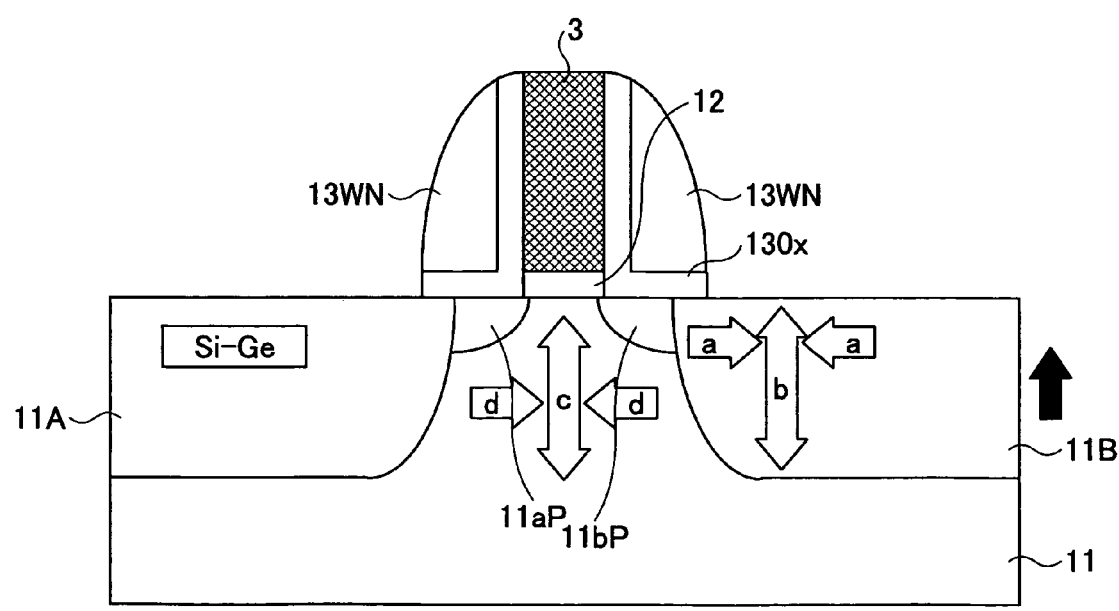
FIG. 3 is a diagram explaining the principle of the MOS transistor of FIG. 2.
Figure 4A:
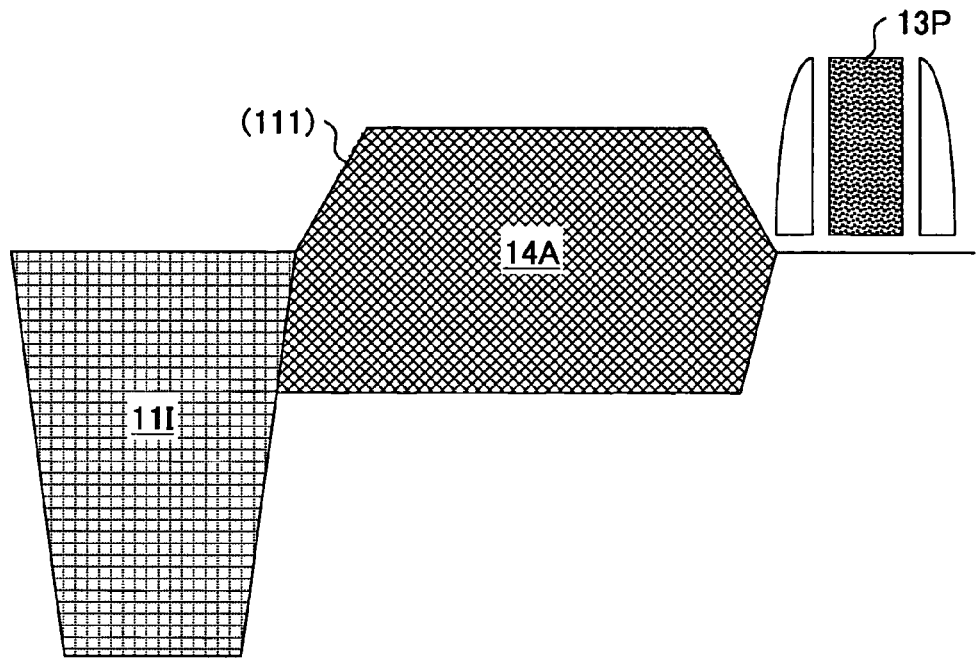
FIGS. 4A and 4B are diagrams explaining the problem occurring in the MOS transistor of FIG. 2 with subsiding of STI structure.
Figure 4B:
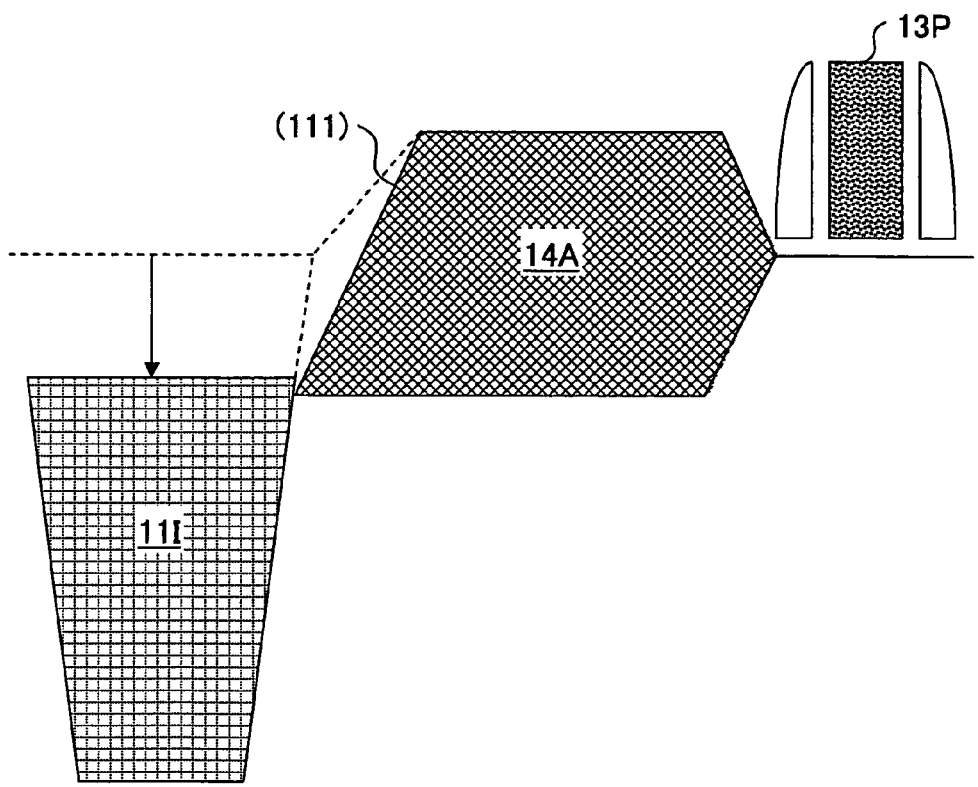
Figure 5:
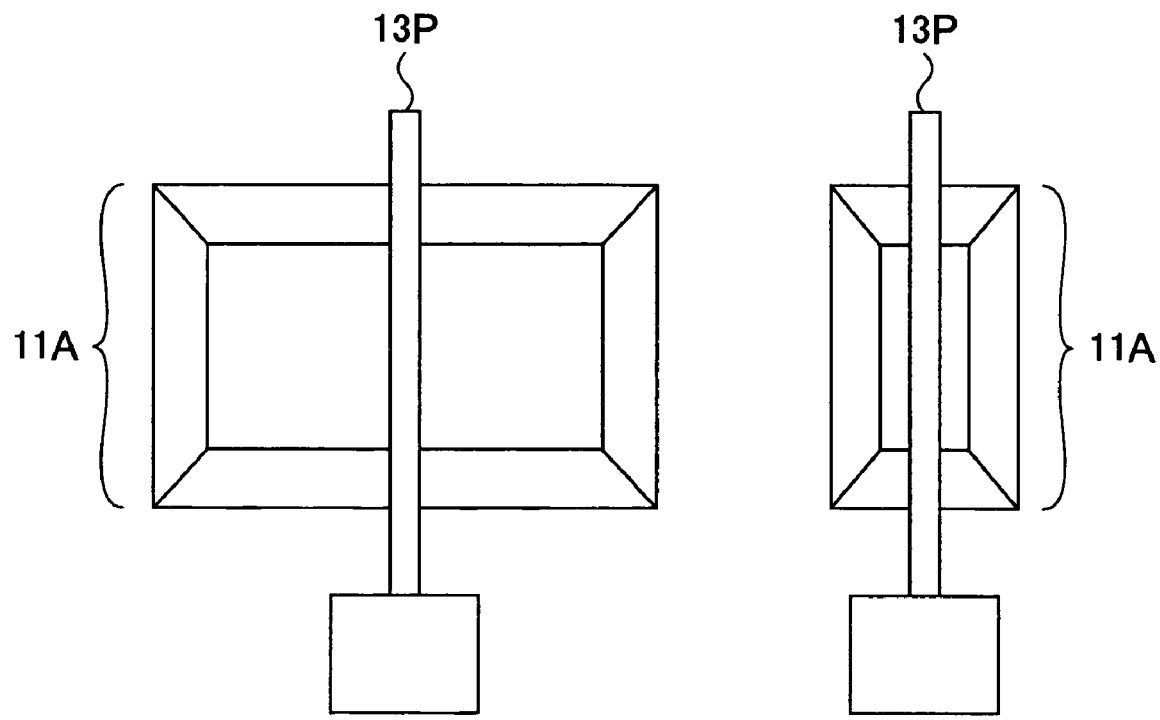
FIG. 5 is another diagram explaining the problem caused in the MOS transistor of FIG. 2 with subsiding of STI structure.

According to the present embodiment, there occurs no subsiding in the STI structure constituting the device isolation region 20, and thus, there occurs no rounding at the edge part of the device region 20A explained with reference to FIG. 1B, even in the case that the surface of the silicon substrate 20 is treated by thermal annealing process in hydrogen ambient prior to the formation of the gate insulation film 12. Thereby, there occurs no decrease in the effective volume of the SiGe compressive stress sources 14A and 14B explained with reference to FIG. 4B.

Further, because there occurs no subsiding of STI structure in the present embodiment, curvature in the surface of the device region is eliminated and it becomes possible to achieve a control of gate width in the device region easily. Further, it becomes possible to form high quality gate insulation film on such a device region of (100) surface orientation. Further, occurrence of leakage current along the device isolation region is suppressed. It should be noted that the foregoing features are by no means limited to the specific semiconductor device of FIG. 9.

Second Embodiment

FIGS. 10A-10G show the fabrication process of a semiconductor device according to a second embodiment of the present invention, wherein those parts corresponding to the parts explained previously are designated by the same reference numerals and the description thereof will be omitted.

Figure 10A:
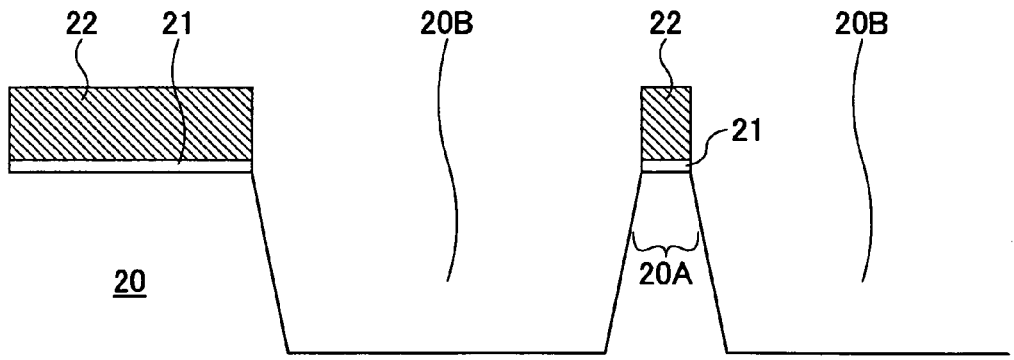
FIGS. 10A-10G are diagrams explaining the fabrication process of a semiconductor device according to a second embodiment of the present invention.
Figure 10B:
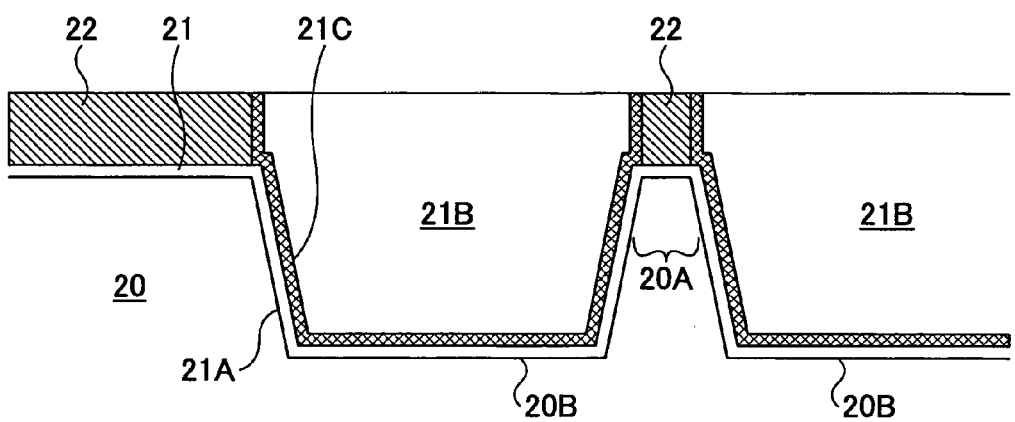
Figure 10C:
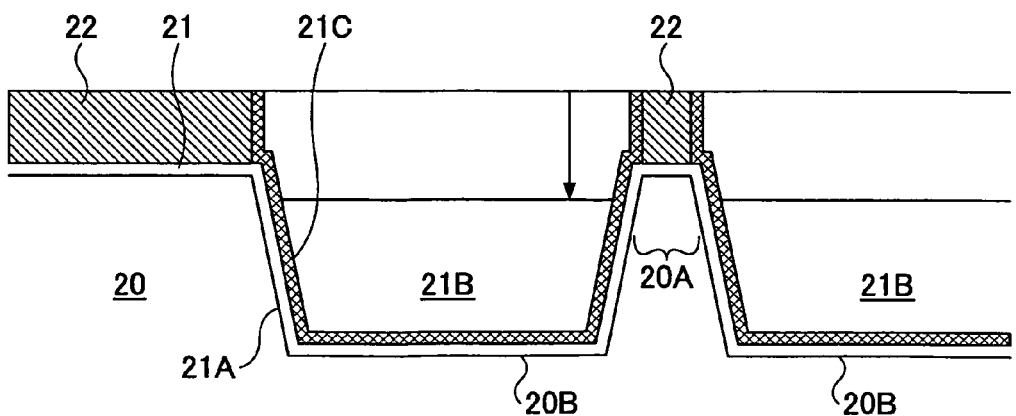
Figure 10D:
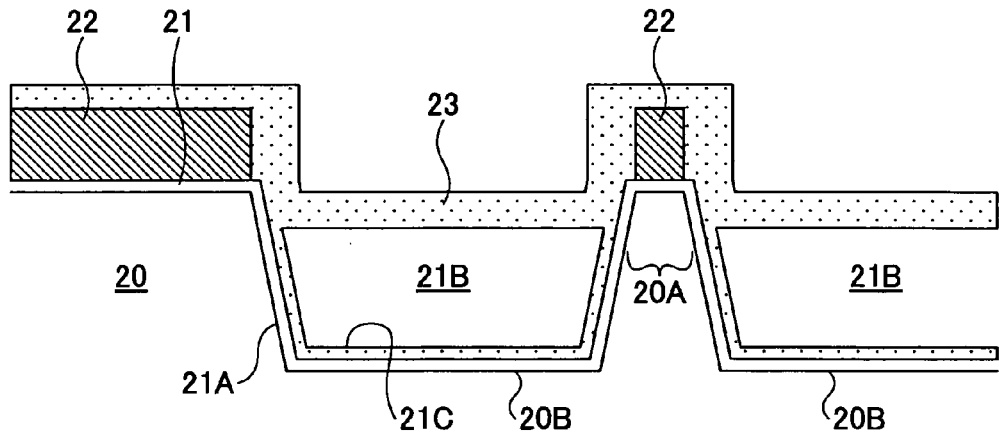
Figure 10E:
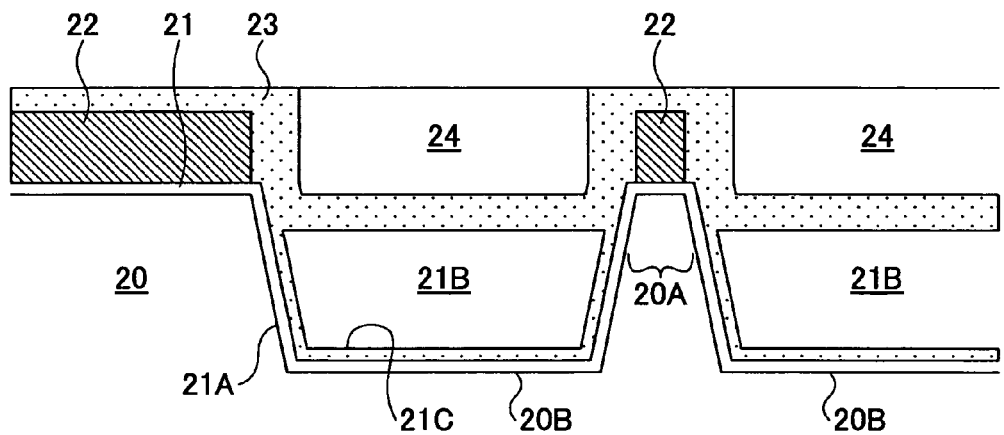
Figure 10F:
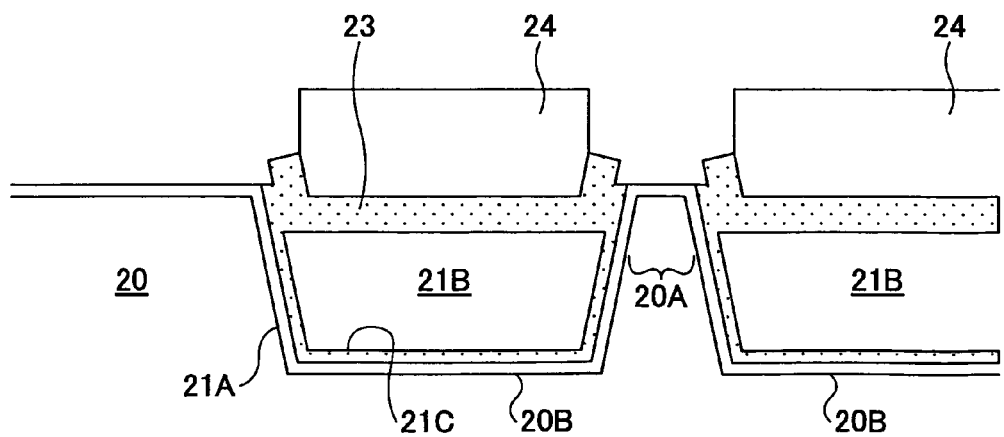

Referring to FIG. 10A, the device isolation trenches 20B are formed on the silicon substrate 20 with the present embodiment so as to define a device region 20A while using the SiN pattern as a mask, similarly to FIG. 6A, and in the step of FIG. 10B, the thermal oxide film 21A is formed with the thickness of about 3 nm so as to cover the sidewall surfaces and bottom surface of the device region 20A.

In the present embodiment, it should be noted that an SiCN film 21C accumulating therein a tensile stress is formed in the step of FIG. 10B on the structure thus formed by conducting a low-pressure CVD process while using bis-tertiary butylaminosilane as the source material, such that the SiCN film 21C covers the sidewall surface and the bottom surface of the device isolation trench 20A with the thickness of about 20 nm, for example. Further, a CVD oxide film 21B is deposited thereon so as to fill the device isolation trenches 20B. Further, in the step of FIG. 10B, the CVD oxide film 21B deposited on the SiN pattern 22 is polished away by a CMP process until the SiN pattern 22 is exposed.

After the step of FIG. 10B, the process steps similar to those of FIGS. 6B-6G are conducted in the steps of FIGS. 10C-10G, and a structure in which the upper part of the device isolation trench 20B is covered with the HF-resistant film 23 of SiOCN or SiCN is obtained.

In present embodiment, it should be noted that an SiCN film 21C accumulating therein a tensile stress is formed on the sidewall surface and bottom surface of the device isolation trench 20B as a result of the process of FIG. 10B, wherein such an SiCN film 21C functions so as to reduce the compressive stress exerted to the device region 22A by the CVD oxide film 21B formed by a high density plasma CVD process. Thus, by forming an n-channel MOS transistor in such a device region 22A, it becomes possible to reduce the deterioration of the operational speed thereof caused by the compressive stress applied to the channel region by the CVD oxide film 21B in the isolation trench 20B.

Figure 10G:
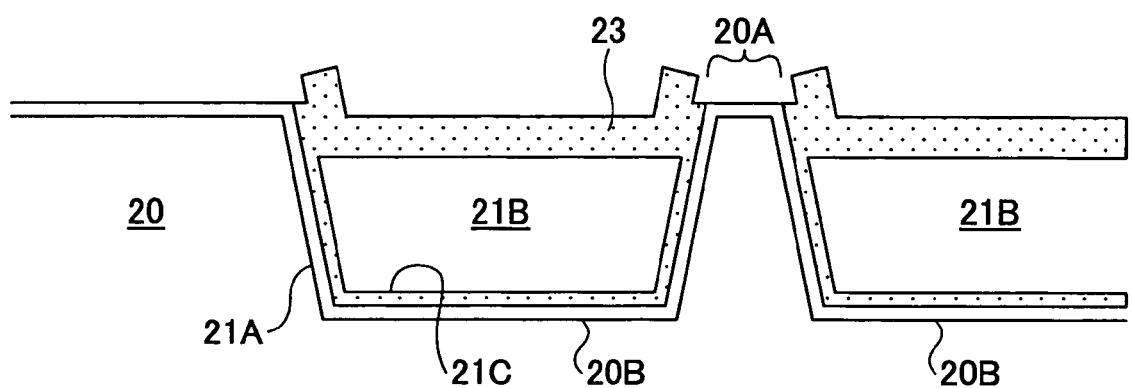
Figure 11:
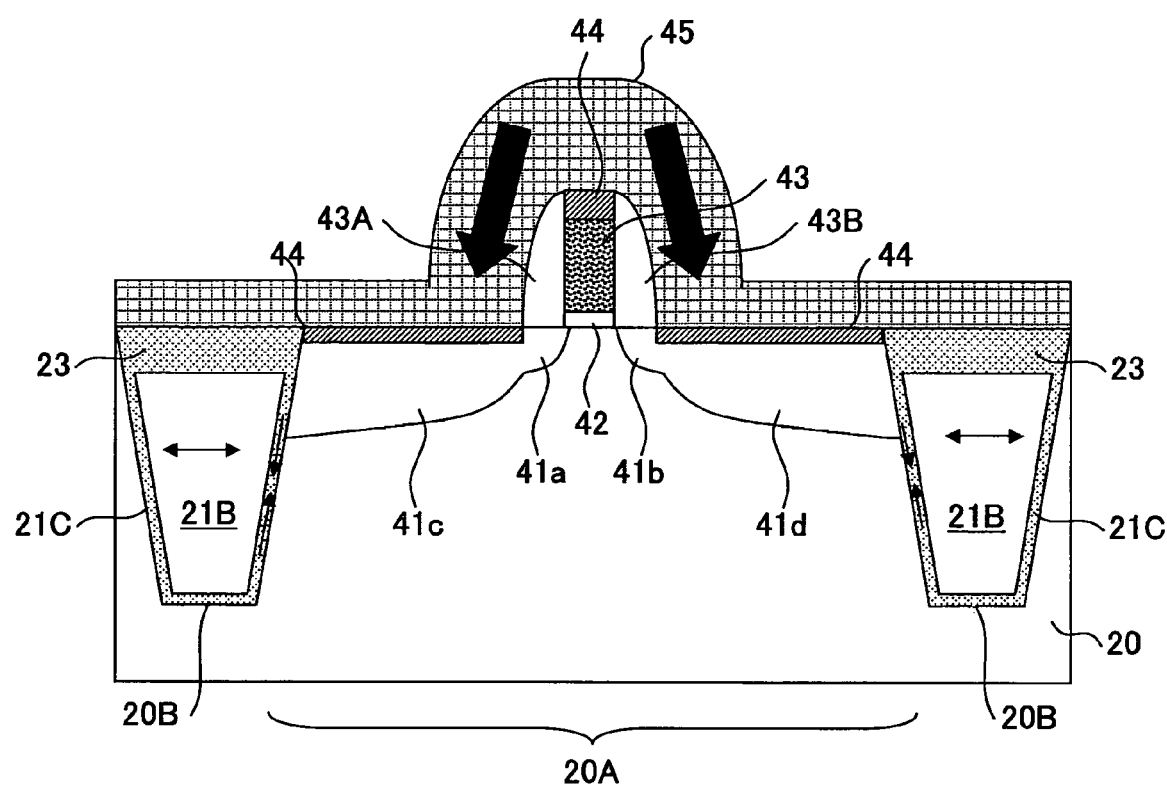
FIG. 11 is a diagram showing the construction of the semiconductor device according to the second embodiment of the present invention.

FIG. 11 shows the construction of an n-channel MOS transistor formed in the device region 20A of FIG. 10G, wherein it should be noted that illustration of the thermal oxide film 21A is omitted in FIG. 11.

Referring to FIG. 11, the n-channel MOS transistor includes $n^+$-type polysilicon gate electrode 43 formed in correspondence to the channel region via a gate insulation film 42, wherein a source extension region 41a and a drain extension region 41b of n-type are formed in the device region 20A of the silicon substrate 20 in correspondence to respective lateral sides of the polysilicon gate electrode 43.

On the sidewall surfaces of the polysilicon gate electrode 44, there are formed sidewall insulation films 43A and 43B, respectively, and source and drain regions 41c and 41d of $n^+$-type are formed in the silicon substrate 20 at respective outer sides of the sidewall insulation films 43A and 43B. Further, a silicide layer 44 is formed on the source region 41c, the drain region 41d and the polysilicon gate electrode 43.

Further, in the construction of FIG. 11, an SiN film 45 accumulating therein a tensile stress is formed on the silicon substrate 20 as a stress resource so as to cover the gate electrode 43 and the sidewall insulation films 43A and 43B, wherein the SiN film 45 urges the surface of the silicon substrate 20 of the gate electrode 43 from upward direction. As a result, the silicon substrate 20 undergoes deformation similarly to the state in which an in-plane tensile stress is applied to the region near the channel region, and electron mobility in the channel region is improved significantly.

With such a construction, there is a need of applying an in-plane tensile stress to the channel region, while the CVD oxide film 21B formed by a high density plasma CVD process and filling the device isolation trench 20B exerts a compressive stress to the silicon substrate 20 in the direction of reducing the in-plane tensile stress. By forming the SiCN film 21C accumulating the tensile stress on the surface of the device isolation trench, it becomes possible to cancel out the effect of such a compressive stress.

Third Embodiment

FIGS. 12A-12D show the fabrication process of a semiconductor device according to a third embodiment of the present invention, wherein those parts of drawing explained previously are designated by the same reference numerals and the description thereof will be omitted.

Figure 12A:
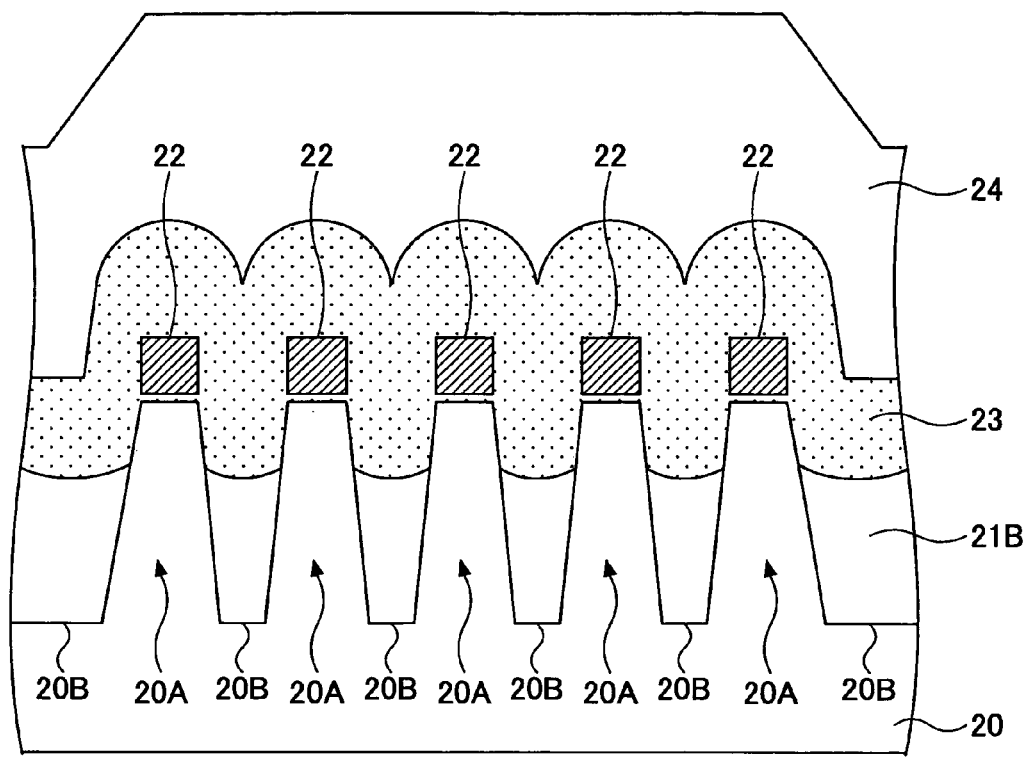
FIGS. 12A-12D are diagrams showing the fabrication process of a semiconductor device according to the third embodiment of the present invention.

Referring to FIG. 12A, there are formed large number of minute device regions 20A on the silicon substrate 20 by the device isolation trenches, wherein each device isolation trench is filled, at a lower part thereof, partially by a CVD oxide film deposited by a high density plasma CVD process. Further, there is formed an HF-resistant film 23 of SiOCN thereon by a low-pressure CVD process conducted at the pressure of 100 Pa or less while using bis-tertiary butylaminosilane as a source material, such that the HF-resistant film 23 covers the SiN pattern 22 in the device region 20A and fills the upper part of the device isolation trench 20B.

Further, in the step of FIG. 12A, there is formed a CVD oxide film 24 on the HF-resistant film 23 in the step of FIG. 12A so as to fill the depressions formed in the HF-resistant film 23.

Figure 12B:
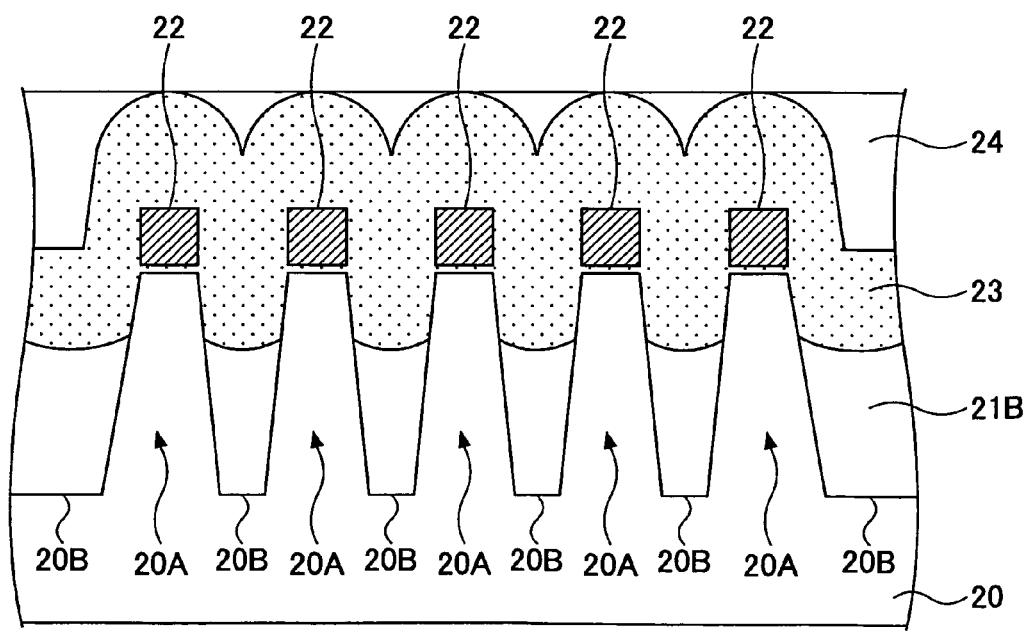

Next, in the step of FIG. 12B, the CVD oxide film 24 is polished away by a CMP process that uses slurry of ceria ($CeO_2$), until the HF-resistant film 23 is exposed. In the step of FIG. 12B, it should be noted there is formed a planarized surface as a result of application of the CMP process.

Figure 12C:
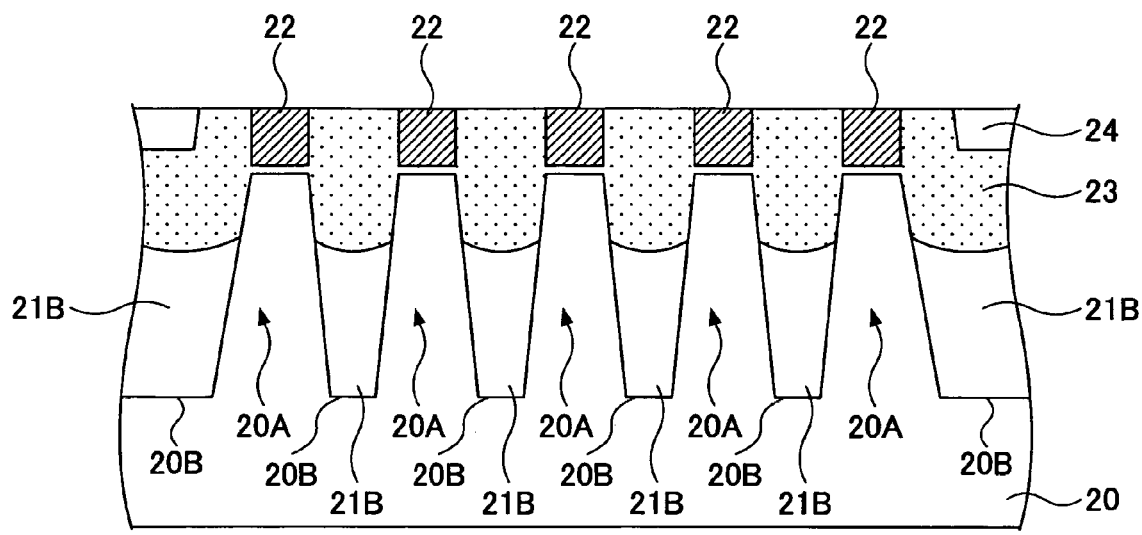
Figure 12D:
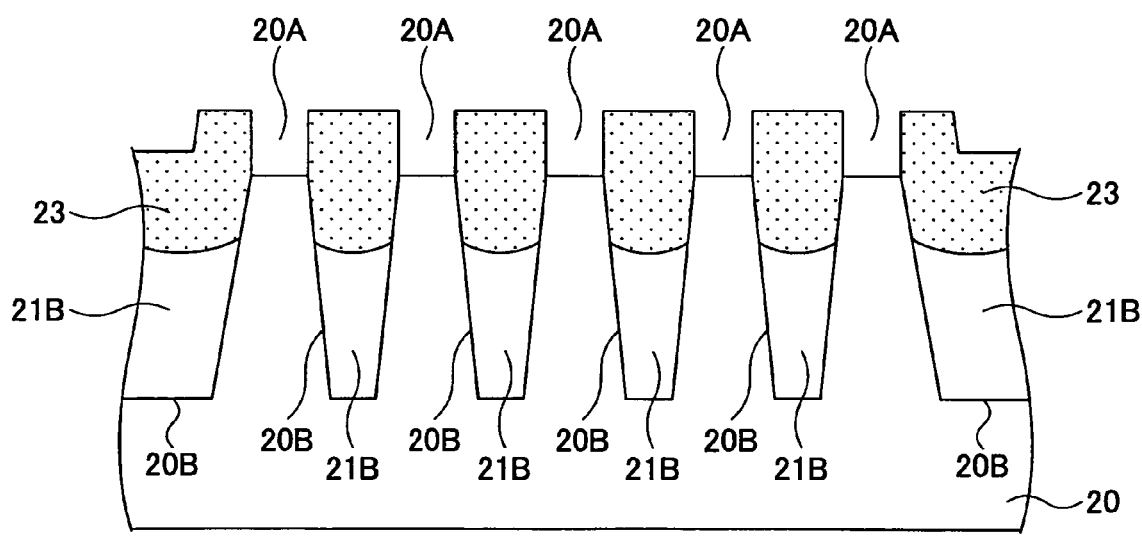

Next, in the step of FIG. 12C, the structure of FIG. 12B is polished by a CMP process that uses silica ($SiO_2$) as the slurry, until the SiN pattern 22 is exposed, and the SiN pattern 22 is dissolved in the step of FIG. 12D by a pyrophosphoric acid treatment. Further, by removing the thermal oxide film 21 formed on the device region 20A between the silicon substrate 20 and the SiN patterns 22 is removed by an HF treatment, and a substrate having a construction in which the device regions 20A are densely arranged on the silicon substrate 20 is obtained as shown in FIG. 12D. Here, it should be noted that FIG. 12D corresponds to the situation in which the SiOCN film 23 has a larger resistance against the pyrophosphoric acid treatment as compared with the SiN film 22, and thus, the SiOCN film 23 forms the patterns projecting upward around the device regions 20A.

With such a structure, there occurs no subsiding of the device isolation regions, and thus, there is caused no problem of curved surface for the device regions even when a thermal annealing process is applied in hydrogen ambient in preparation for the formation of gate insulation film. Further, it is also possible with the present embodiment to form the SiCN tensile stress film 21C explained with reference to the embodiment of FIGS. 10A-10G also on the surface of the device isolation trench.

Fourth Embodiment

Figure 13A:
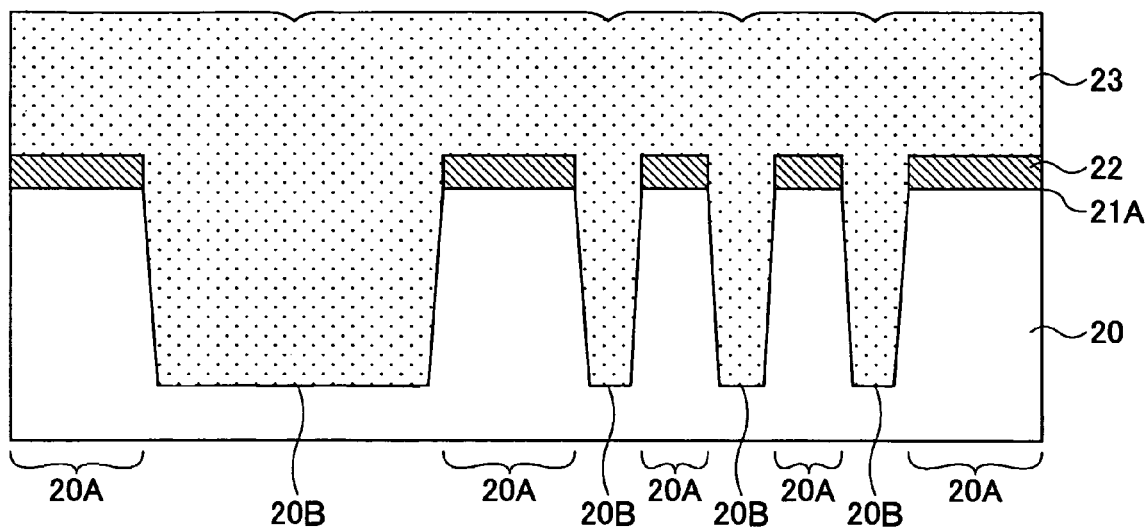
FIG. 13A and 13B are diagrams showing the fabrication process of a semiconductor device according to a fourth embodiment of the present invention.
Figure 13B:
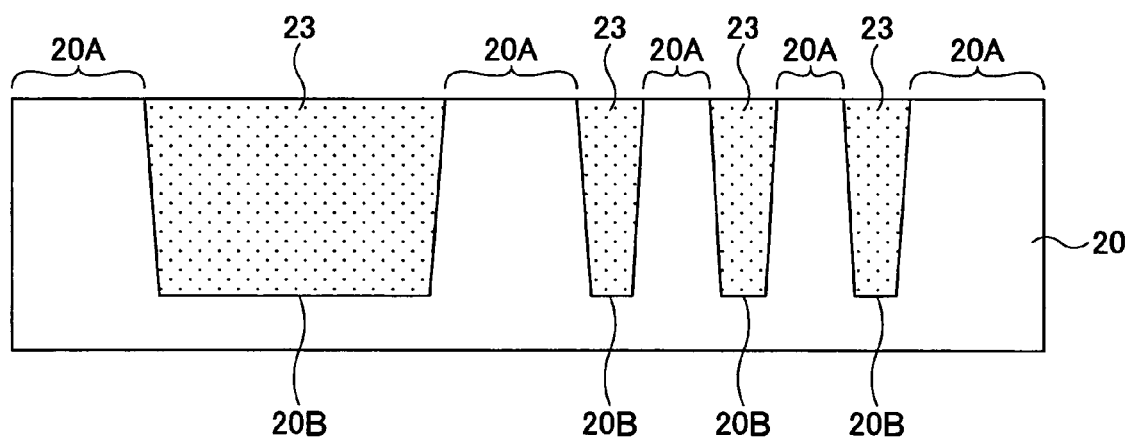

FIGS. 13A and 13B show the fabrication process of a semiconductor device according to a fourth embodiment of the present invention, wherein those parts corresponding to the parts explained previously are designated by the same reference numerals and the description thereof will be omitted.

Referring to FIGS. 13A and 13B, the device isolation trenches 20B formed on the silicon substrate 20 include the trenches of large area and also the trenches of small area, wherein the example of FIG. 13A shows the case in which the device isolation trenches of small area are densely arranged to define the device regions 20A of small area.

In the state of FIG. 13A, the HF-resistant film 23 of SiOCN or SiCN fills any of the device isolation trenches of large area and the device isolation trenches of small area uniformly from the bottom part to the top part thereof, and the CVD silicon oxide film is not formed in the device isolation trenches.

In the step of FIG. 13B, the HF-resistant 23 on the silicon substrate 20 is removed by a CMP process until the thermal oxide film 21A between the silicon substrate 20 and the SiN pattern 22 is exposed. The thermal oxide film 21A thus exposed is then removed by an HF treatment.

With such a process, too, it is possible to form a silicon substrate free from subsiding in the device region.

Fifth Embodiment

Figure 14A:
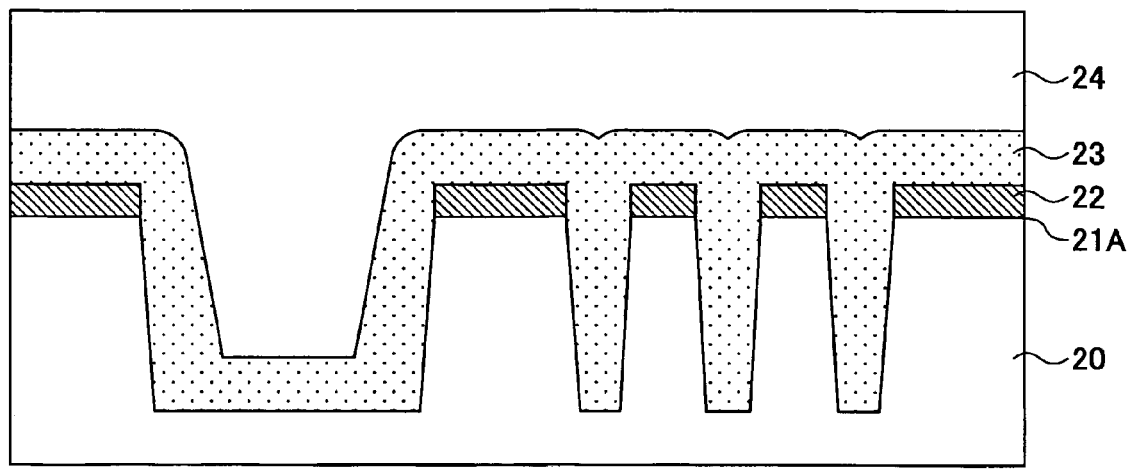
FIGS. 14A and 14B are diagrams showing the fabrication process of a semiconductor device according to a fifth embodiment of the present invention.
Figure 14B:
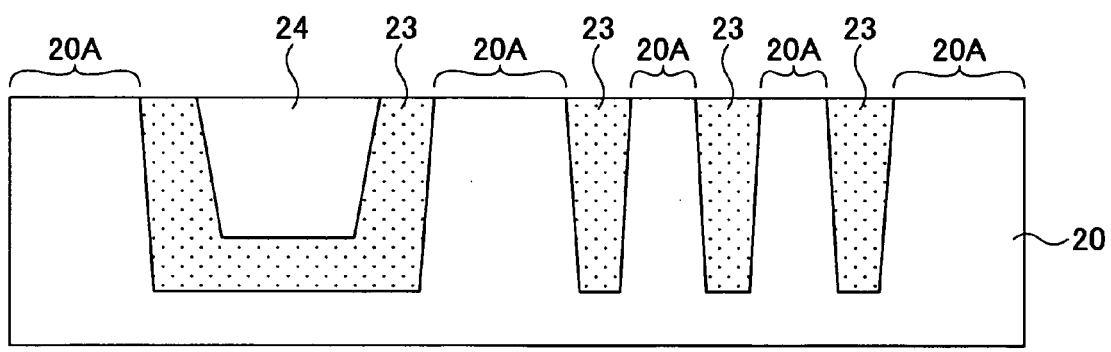

FIGS. 14A and 14B show the fabrication process of a semiconductor device according to a fifth embodiment of the present invention, wherein those parts corresponding to the parts explained previously are designated by the same reference numerals and the description thereof will be omitted.

Referring to FIGS. 14A and 14B, the device isolation trenches 20B formed on the silicon substrate 20 include the trenches of large area and also the trenches of small area, wherein the example of FIG. 14A shows the case in which the device isolation trenches of small area are densely arranged to define the device regions 20A of small area.

In the state of FIG. 14A, the HF-resistant film 23 of SiOCN or SiCN fills the device isolation trenches of small area uniformly from the bottom part to the top part thereof, and the CVD silicon oxide film is not formed in the device isolation trenches. On the other hand, in the device isolation trenches of large area, the HF-resistant film 23 is formed in conformity with the shape of the trench, and thus, there is formed a void inside the trenches.

Thus, in the step of FIG. 14A, the CVD film 24 is deposited by a high density plasma CVD process on the HF-resistant film 23 so as to fill the void, and in the step of FIG. 14B, the CVD oxide film 24, the HF-resistant film and the SiN pattern 22 are removed consecutively by a CMP process, until the thermal oxide film 21A between the silicon substrate 20 and the SiN paten 22 is exposed. Further, by removing the thermal oxide film 21A by an HF treatment, it becomes possible to obtain a silicon substrate having a planarized surface free from subsiding in the device isolation structure.

Further, while the foregoing explanation has been made for the example of ultrafine and ultra-high speed transistors in which increase of operational speed is attained in the semiconductor device formed in the device region by application of stress, the present invention is not limited to such a specific semiconductor device, and thus, the present invention is useful also in the fabrication of semiconductor integrated circuit device in which a high-voltage transistor, a mid-voltage transistor and a low-voltage transistor are integrated on a common silicon substrate.

Further, the present invention is not limited to the embodiments described heretofore, but various variations and modifications may be made without departing from the scope of the invention.

What is claimed is:

1. A method of fabricating a semiconductor device, comprising the steps of:
    forming a device isolation trench in a silicon substrate while using an SiN pattern as a mask;
    forming, after said step of forming said device isolation trench, a silicon oxide film in said device isolation trench to cover said SiN pattern;
    removing a part of said silicon oxide film located above said SiN pattern by a polishing process;
    removing, after said polishing process, a part of said silicon oxide film in said device isolation trench while leaving said silicon oxide film on a bottom part of said device isolation trench;
    depositing, after said step of removing a part of said silicon oxide film in said device isolation trench, an HF resistant film comprising SiOCN or SiCN so as to cover said silicon oxide film left on said bottom part of said device isolation trench and to fill at least a top part of said device isolation trench and so as to cover said SiN pattern; and
    removing said SiN pattern and said HF-resistant film on said SiN pattern, such that said HF-resistant film has a top surface flush to or above a top surface of said silicon substrate.

2. The method as claimed in claim 1, wherein said low-pressure CVD process forms an SiOCN film as said HF-resistant film by causing to react bis tertiary butylaminosilane with any of oxygen or $N_2O$.

3. The method as claimed in claim 2, wherein said low-pressure CVD process is conducted under a process pressure of 100 Pa or less.

4. The method as claimed in claim 1, wherein said low-pressure CVD process forms an SiCN film as said HF-resistant film by causing to react bis tertiary butylaminosilane with ammonia.

5. The method as claimed in claim 1, wherein said low-pressure CVD process is conducted such that said HF-resistant film fills said device isolation trench from a bottom part thereof to a top part thereof.

6. The method as claimed in claim 1, wherein said SiOCN film has a refractive index of 1.670 or more.

7. The method as claimed in claim 1, wherein said HF-resistant film being formed by a low-pressure CVD process while using bis-tertiary butylaminosilane as a source material.

8. A method of fabricating a semiconductor device, comprising the steps of:
    forming a device isolation trench in a silicon substrate while using an SiN pattern as a mask;
    depositing an HF resistant film comprising SiOCN or SiCN so as to fill at least a top part of said device isolation trench and so as to cover said SiN pattern; and
    removing said SiN pattern and said HF-resistant on said SiN pattern, said method further comprising, after said step of forming said device isolation trench but before deposition of said HF-resistant film, the step of filling a bottom part of said device isolation trench by a silicon oxide film excluding a top part of said device isolation trench,
    said step of depositing said HF-resistant film is conducted such that said HF-resistant film covers said silicon oxide film in said device isolation trench and such that said HF-resistant film fills said top part of said device isolation trench,
    said step of removing said SiN pattern and said HF-resistant film being conducted by a wet etching process while using a silicon oxide pattern formed on said HF-resistant film in correspondence to said device isolation trench as a mask.

9. The method as claimed in claim 8, wherein said step of filling said silicon oxide film at said bottom part of said device isolation trench comprises the step of depositing, after said step of forming said device isolation trench but before said step of depositing said HF-resistant film, a silicon oxide film so as to fill said device isolation trench from said bottom part to said top part, and removing a part of said silicon oxide film filling said top part of said device isolation trench.

10. A method for fabricating a semiconductor device, comprising the steps of:
    forming a mask layer on a semiconductor substrate;
    forming a trench in said semiconductor substrate by etching said semiconductor substrate while using said mask layer as a mask;
    depositing an insulation film in an interior of said trench and over said mask layer;
    removing said insulation film located over said mask layer by a polishing process;

depositing an HF-resistant film over said insulation film embedded in said trench and over said mask layer; and removing said HF-resistant film located over said mask layer by a polishing process.

11. The method as claimed in claim 10, wherein said HF-resistant film is an SiOCN film.

* * * * *